United States Patent
Fujiwara et al.

(10) Patent No.: US 6,933,780 B2
(45) Date of Patent: Aug. 23, 2005

(54) PREDISTORTION CIRCUIT AND POWER AMPLIFIER

(75) Inventors: Seiji Fujiwara, Yokosuka (JP); Toru Matsuura, Katano (JP); Kaoru Ishida, Shijonawate (JP); Makoto Sakakura, Uji (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 46 days.

(21) Appl. No.: 09/772,883

(22) Filed: Jan. 31, 2001

(65) Prior Publication Data

US 2001/0013809 A1 Aug. 16, 2001

(30) Foreign Application Priority Data

Feb. 3, 2000  (JP) ........................................ 2000-026146

(51) Int. Cl.⁷ ................................................. H03F 1/26
(52) U.S. Cl. ........................ 330/149; 330/302; 330/306; 375/297
(58) Field of Search ................................. 330/149, 302, 330/306; 375/297

(56) References Cited

U.S. PATENT DOCUMENTS

| | | | |
|---|---|---|---|
| 5,038,113 A | | 8/1991 | Katz et al. ................... 330/277 |
| 5,805,023 A | * | 9/1998 | Fukuden ...................... 330/302 |
| 5,914,641 A | * | 6/1999 | Yun et al. .................... 330/302 |
| 6,107,877 A | * | 8/2000 | Miguelez et al. .............. 330/66 |

FOREIGN PATENT DOCUMENTS

| | | |
|---|---|---|
| JP | 3-19507 | 1/1991 |
| JP | 3-190301 | 8/1991 |
| JP | 4029403 | * 1/1992 |
| JP | 4-326206 | 11/1992 |
| JP | 9-232901 | 9/1997 |
| JP | 10-145147 | 5/1998 |
| WO | WO 99/10987 | 3/1999 |

OTHER PUBLICATIONS

Moon–suk et al. "A New Active Predistortor With High Gain Using Cascode—FET Structures" Radio Frequency Integrated Circuits Symposium 2002 IEEE pp. 253–256.*

Horn "Basic Electronics Theory" 4$^{th}$ Edition Tab books 1994 pp 79, 145.*

* cited by examiner

Primary Examiner—Michael B Shingleton
(74) Attorney, Agent, or Firm—Smith, Gambrell & Russell, LLP

(57) ABSTRACT

A predistortion circuit has
   an input terminal for inputting a predetermined signal;
   a nonlinear device directly or indirectly connected to the input terminal;
   a bias supply circuit for applying a voltage to the nonlinear device;
   specific-frequency suppressing means connected to one side or both sides of the nonlinear device directly without another intervening device and of suppressing all or part of such frequencies that are from a frequency corresponding to DC to a frequency corresponding to an occupied band width of an input signal inputted to the input terminal and/or suppressing at least one higher harmonic frequency of a carrier wave of the input signal; and
   an output terminal for outputting a signal.

19 Claims, 14 Drawing Sheets

PREDISTORTION CIRCUIT AND POWER AMPLIFIER

BACKGROUND OF THE INVENTION

1. Field of the Invention

In amplifiers, there is the problem of occurrence of intermodulation distortion caused by the deviation of gain and phase when input power change. The present invention relates to a predistortion circuit for suppressing the occurrence of such intermodulation distortion.

2. Related Art of the Invention

As a linearizing method for suppressing the occurrence of intermodulation distortion by compensating the deviation in amplitude and phase when input power change, a predistortion scheme is known. FIG. 5 is a diagram showing the configuration and the principle of such a predisotortion scheme. First, the configuration of the predisotortion scheme shown in FIG. 5(a) is explained below. Here, an input signal is assumed to be composed of two continuous wave signals each having a different frequency component.

A signal is input from an input terminal 501, and then input to a distortion generating circuit (predistortion circuit) 502 comprising a diode, a transistor, and the like. After passing through the distortion generating circuit 502, the signal is output such as to involve a intermodulation distortion having an amplitude and phase relation so as to cancel the intermodulation distortion component to be generated by an amplifier 503 in the following stage. The signal is then input to the amplifier 503.

FIG. 5(b) shows an input signal, and FIG. 5(c) shows the spectral relation between the intermodulation distortion component of the distortion generating circuit 502 and the intermodulation distortion component of the amplifier 503. The spectrum of the input signal of the distortion generating circuit 502, consists of two basic signal frequencies f1, f2 shown in FIG. 5(b). The amplitudes of the frequencies f1, f2 in FIG. 5(c) are drawn in the same size as the amplitudes of the corresponding frequencies in FIG. 5(b) However, this is for the purpose of simplicity of description, and the actual amplitudes have been amplified.

In the spectrum shown in FIG. 5(c) of the output signal being output from the amplifier 503 to the output terminal 504, in addition to the basic signal frequencies f1, f2, there are third order intermodulation distortion components of frequencies 2f1–f2, 2f2–f1 generated by the amplifier 503, third order intermodulation distortion components of frequencies 2f1–f2, 2f2–f1 generated by the distortion generating circuit 502, fifth order intermodulation distortion components of frequencies 3f1–2f2, 3f2–2f1 generated by the amplifier 503, and fifth order intermodulation distortion components of frequencies 3f1–2f2, 3f2–2f1 generated by the distortion generating circuit 502.

As shown in FIG. 5(c), when the distortion generating circuit 502 previously generates such intermodulation distortion components as to cancel the intermodulation distortion components to be generated by the amplifier 503, an output signal is obtained without distortion in the output terminal 504.

[Problems to be Solved by the Invention]

However, for example the prior art distortion generating circuit 502 has been composed of a predistortion circuit shown in FIG. 9. Accordingly, as shown in FIG. 10, the distortion generating circuit 502 has generated signal components (f2–f1) of the differential frequencies of the input signal, 2(f2–f1) of the higher harmonics of it and at least one of the higher harmonic signal components 2f1, 2f2, (f1+f2) and so on of the carrier wave of the input signal.

These signal components (f2–f1), 2(f2–f1), 2f1, 2f2, (f1+f2) and the basic signal frequencies f1, f2 interfere with each other. This fact has been prevented the amplitude of the signal component generated by the distortion generating circuit 502 from being substantially matched with the amplitude of the signal component generated by the amplifier 503 in each of the frequencies 2 f1–f2, 2f2–f1, 3f1–2f2, 3f2–2f1 by adjusting the amplitude of the input signal and the voltage applied the circuit. Shown in FIG. 10 is the signal components output from the distortion generating circuit 502 after the interference between the signal components (f2–f1), 2(f2–f1), 2f1, 2f2, (f1+f2) and the basic signal frequencies f1, f2.

FIG. 6(a) shows an example of the basic signal frequencies f1, f2, the third order intermodulation distortion components of the frequencies 2f1–f2, 2f2–f1, and the fifth order intermodulation distortion components of the frequencies 3f1–2f2, 3f2–2f1 in the signal output from the amplifier 503.

As shown in FIG. 6(a), the amplitude of the signal component generated by the distortion generating circuit 502 is different from the amplitude of the signal component generated by the amplifier 503 in each of the third order intermodulation distortion components of the frequencies 2f1–f2, 2f2–f1. Similarly, the amplitude of the signal component generated by the distortion generating circuit 502 is different from the amplitude of the signal component generated by the amplifier 503 in each of the fifth order intermodulation distortion components of the frequencies 3f1–2f2, 3f2–2f1. Accordingly, as shown in FIG. 6(b), the third order intermodulation distortion components of the frequencies 2f1–f2, 2f2–f1 remain in the actual signal output from the amplifier 503, and so do the fifth order intermodulation distortion components of the frequencies 3f1–2f2, 3f2–2f1. As such, the distortion suppression is insufficient, and this has been a problem in the prior art.

The amplitudes of the frequencies f1, f2 in FIG. 6(b) are drawn in the same size as the amplitudes of the corresponding frequencies in FIG. 6(a). However, this is for the purpose of simplicity of description, and the actual amplitudes have been amplified.

SUMMARY OF THE INVENTION

The present invention has been devised to resolve such a problem. An object of the present invention is to provide a predistortion circuit for generating the intermodulation distortion components capable of substantially canceling the intermodulation distortion components generated by an amplifier.

The $1^{st}$ invention of the present invention is a predistortion circuit comprising:

an input terminal for inputting a predetermined signal;

a nonlinear device directly or indirectly connected to said input terminal;

a bias supply circuit for applying a voltage to said nonlinear device;

specific-frequency suppressing means connected to one side or both sides of said nonlinear device directly without another intervening device and of suppressing all or part of such frequencies that are from a frequency corresponding to DC to a frequency corresponding to an occupied band width of an input signal inputted to said input terminal and/or suppressing at least one higher harmonic frequency of a carrier wave of said input signal; and an output terminal for outputting a signal.

The $2^{nd}$ invention of the present invention is a predistortion circuit of $1^{st}$ invention, wherein said specific-frequency suppressing means has such impedance that the impedance of said specific-frequency suppressing means viewed from the connection point to which said specific-frequency suppressing means is connected is lower than the impedance of said nonlinear device viewed from said connection point at all or part of such frequencies that are from said frequency corresponding to DC to said frequency corresponding to said occupied band width and/or at least one higher harmonic frequency of a carrier wave of said input signal.

The 3$^{rd}$ invention of the present invention is a predistortion circuit of 1$^{st}$ invention, wherein said nonlinear device is provided between the connection point between said input terminal and said output terminal and the ground.

The 4$^{th}$ invention of the present invention is a predistortion circuit of 1$^{st}$ invention, wherein said nonlinear device is connected between said input terminal and said output terminal.

The 5$^{th}$ invention of the present invention is a predistortion circuit of 1$^{st}$ invention, wherein: said nonlinear device is a transistor; said input terminal is connected to any one of the drain and the source of said transistor; said output terminal is connected to the other of the drain and the source of said transistor; and said bias supply circuit is connected to the gate of said transistor.

The 6$^{th}$ invention of the present invention is a predistortion circuit of any one of 1$^{st}$ to 5$^{th}$ inventions, wherein said specific-frequency suppressing means comprises the all or a part of a resistor, a coil, a capacitor, and a transmission line.

The 7$^{th}$ invention of the present invention is a predistortion circuit of any one of 1$^{st}$ to 4$^{th}$ inventions, wherein said nonlinear device comprises a diode.

The 8$^{th}$ invention of the present invention is a predistortion circuit of any one of 1$^{st}$ to 4$^{th}$ inventions, wherein said nonlinear device comprises a transistor.

As described above, in a predistortion circuit of the present invention, specific-frequency suppressing means of suppressing all or part of such frequencies that are from a frequency corresponding to DC to a frequency corresponding to an occupied band width of an input signal inputted to input terminal and/or suppressing at least one higher harmonic frequency of a carrier wave of input signal is connected to at least one of the input and the output of a nonlinear device, thereby removing unnecessary distortion components caused by the distortion occurring in all or part of such frequencies that are from a frequency corresponding to DC to a frequency corresponding to an occupied band width of an input signal inputted to input terminal and/or at least one higher harmonic frequency of the carrier wave of the input signal.

As such, the situation can be alleviated that the amplitudes differ from each other in each third order intermodulation distortion component occurring at each frequency 2f1–f2, 2f2–f1 and that the amplitudes differ from each other in each fifth order intermodulation distortion component occurring at each frequency 3f1–2f2, 3f2–2f1, whereby sufficient suppression can be achieved.

The 9$^{th}$ invention of the present invention is a power amplifier comprising: a predistortion circuit of any one of 1$^{st}$ to 5$^{th}$ inventions; and an amplifier for amplifying the signal from said predistortion circuit.

The 10$^{th}$ invention of the present invention is a power amplifier of 9$^{th}$ invention, wherein said amplifier comprises:

an input terminal for inputting a signal;

a first matching circuit connected to said input terminal;

a transistor the gate of which is connected to said first matching circuit;

a second matching circuit connected to the drain of said transistor;

an output terminal connected to said second matching circuit and for outputting a signal;

a first bias circuit connected between said first matching circuit and said transistor;

a second bias circuit connected between said second matching circuit and said transistor; and specific-frequency suppressing means connected to one side or both sides of said transistor directly without another intervening device and of suppressing all or part of such frequencies that are from a frequency corresponding to DC to a frequency corresponding to an occupied band width of an input signal inputted to said input terminal and/or suppressing at least one higher harmonic frequency of a carrier wave of said input signal.

DESCRIPTION OF THE REFERENCE NUMERALS

Figure 1:
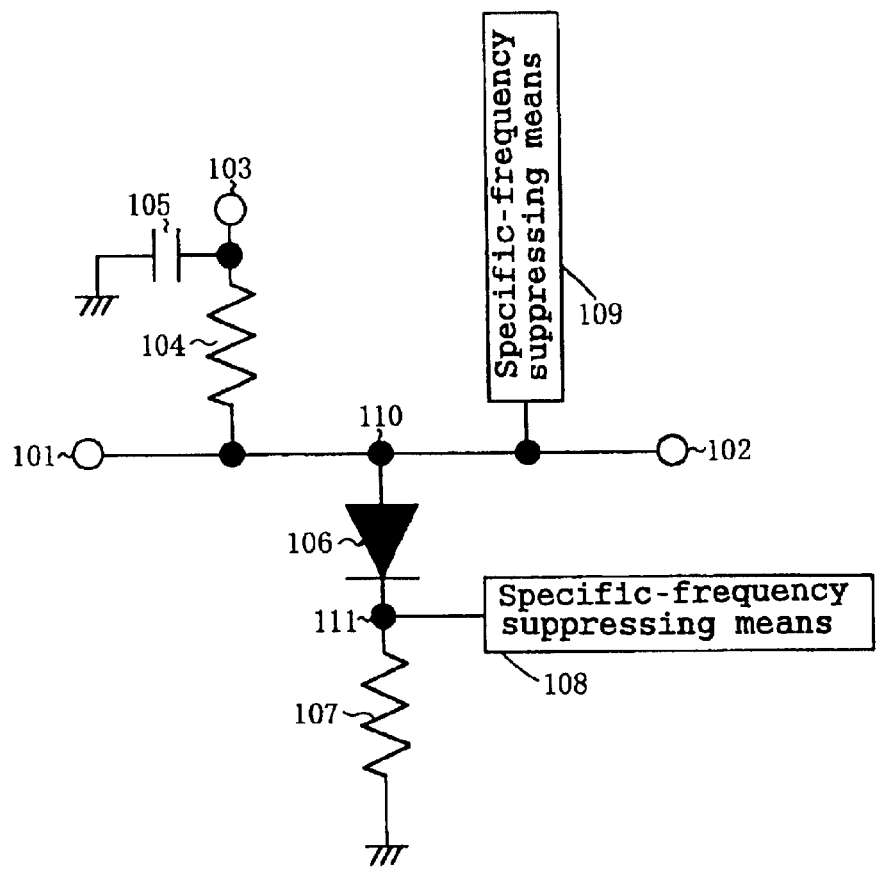
FIG. 1 is a configuration diagram of a predistortion circuit of Embodiment 1 of the present invention.
Figure 1:
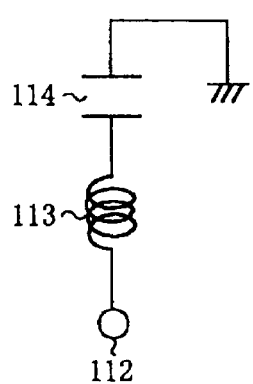
Figure 1:
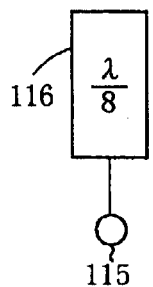
Figure 1:
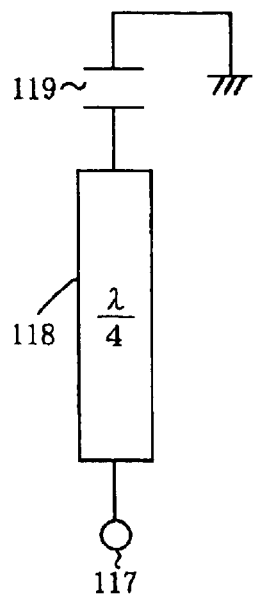

101, 201, 301 Input terminal
102, 202, 302 Output terminal
110, 111, 210, 211, 312, 313, 314 Connection point
112, 115, 117, 212, 215, 217, 315, 318, 320 Connection terminal
106, 206 Diode
305 Transistor
108, 109, 208, 209, 310, 311 Specific-frequency suppressing means
104, 107, 204, 207, 306, 308 Resistor
105, 114, 119, 205, 214, 219, 309, 317, 322 Capacitor
113, 213, 304, 307, 316 Coil
116, 216, 319 λ/8 Line
118, 218, 321 λ/4 Line

PREFERRED EMBODIMENTS OF THE INVENTION

The embodiments of the present invention are described below.

(Embodiment 1)

A predistortion circuit of Embodiment 1 of the present invention is described below with reference to FIG. 1. FIG. 1(*a*) is a configuration diagram of the predistortion circuit of Embodiment 1 of the present invention. As shown in FIG. 1(a), specific-frequency suppressing means 109 having an impedance lower than the input impedance of a diode 106 at all or part of such frequencies that are from a frequency corresponding to DC to a frequency corresponding to an occupied band width of an input signal inputted to the input terminal 101 is connected to a connection point 110 between the diode 106 and an output terminal 102. Further, specific-frequency suppressing means 108 having an impedance lower than the output impedance of the diode 106 at all or part of such frequencies that are from a frequency corresponding to DC to a frequency corresponding to an occupied band width of an input signal inputted to the input terminal 101 is connected to a connection point 111 between the diode 106 and a resistor 107.

Alternatively, it is possible that specific-frequency suppressing means 109 having an impedance lower than the input impedance of a diode 106 at the second harmonic frequency of the input signal is connected to the connection point 110 between the diode 106 and the output terminal 102 and that specific-frequency suppressing means 108 having an impedance lower than the output impedance of the diode 106 at the second harmonic frequency of the input signal is connected to the connection point 111 between the diode 106 and the resistor 107.

Further alternatively, it is possible that specific-frequency suppressing means 109 having an impedance lower than the input impedance of a diode 106 at both a predetermined all or part of such frequencies that are from a frequency corresponding to DC to a frequency corresponding to an occupied band width of an input signal inputted to the input terminal 101 and the second harmonic frequency of the input signal is connected to the connection point 110 between the diode 106 and the output terminal 102 and that specific-frequency suppressing means 108 having an impedance lower than the output impedance of the diode 106 at both a predetermined all or part of such frequencies that are from a frequency corresponding to DC to a frequency corresponding to an occupied band width of an input signal inputted to the input terminal 101 and the second harmonic frequency of the input signal is connected to the connection point 111 between the diode 106 and the resistor 107.

Furthermore, it is possible that only one of the specific-frequency suppressing means 108, 109 is connected to the diode 106.

In Embodiment 1 of the present invention, each specific-frequency suppressing means 108, 109 is used as an example of the specific-frequency suppressing means of a predistortion circuit of the present invention. Each specific-frequency suppressing means 108, 109 is means of suppressing the signal components (f2−f1) of the differential frequencies of the input signal, 2(f2−f1) of the higher harmonics of it and at least one of the higher harmonic signal components 2f1, 2f2, (f1+f2) and so on of the carrier wave of the input signal.

FIG. 1(b) is a diagram showing an example of configuration in which each specific-frequency suppressing means 108, 109 is composed of lumped parameter components. In this example, the means is a serial LC resonance circuit composed of a coil 113 and a capacitor 114 interconnected in series. A connection terminal 112 is connected to the connection point 110, 111. The components values of the coil 113 and the capacitor 114 are selected such that the resonance frequency of the serial LC resonance circuit corresponds to all or part of such frequencies that are from a frequency corresponding to DC to a frequency corresponding to an occupied band width of an input signal inputted to the input terminal 101. Alternatively, the components values of the coil 113 and the capacitor 114 are selected such that the resonance frequency of the serial LC resonance circuit corresponds to the second harmonic frequency of the input signal.

FIG. 1(c) is a diagram showing an example of configuration in which each specific-frequency suppressing means 108, 109 is composed of a transmission line. In this example, the means is an open stub consisting of a $\lambda/8$ line 116. A connection terminal 115 is connected to the connection point 110, 111. The line length of the $\lambda/8$ line 116 is designed with $\lambda$ being the wavelength of the carrier wave. Then, the circuit has a low impedance at frequencies 2f1, 2f2, f1+f2, thereby suppressing these signals.

FIG. 1(d) is a diagram showing an example of configuration in which each specific-frequency suppressing means 108, 109 is composed of a transmission line and a capacitor. In this example, the means is a stub matching circuit consisting of a $\lambda/4$ line 118 and a capacitor 119 interconnected in series. A connection terminal 117 is connected to the connection point 110, 111. The line length of the $\lambda/4$ line 118 is designed with $\lambda$ being the wavelength of the carrier wave. The capacitor 119 connected to the $\lambda/4$ line 118 is selected so as to result in an impedance lower enough at all or part of such frequencies that are from a frequency corresponding to DC to a frequency corresponding to an occupied bandwidth of an input signal inputted to said input terminal 101. Alternatively, the capacitor 119 connected to the $\lambda/4$ line 118 is selected so as to result in an impedance lower enough at the second harmonic frequency of the input signal. Further alternatively, the capacitor 119 connected to the $\lambda/4$ line 118 is selected so as to result in an impedance lower enough at all or part of such frequencies that are from a frequency corresponding to DC to a frequency corresponding to an occupied bandwidth of an input signal inputted to the input terminal 101 and the second harmonic frequency of the input signal. As such, in FIG. 1(d), the impedance viewed from the connection terminal 117 is lower than the input (output) impedance of the diode 106 at all or part of such frequencies that are from a frequency corresponding to DC to a frequency corresponding to an occupied band width of an input signal inputted to the input terminal, and/or at least one higher harmonic frequency of a carrier wave of the input signal.

As such, the predistortion circuit avoids the occurrence of unnecessary distortion components caused by the distortion occurring at all or part of such frequencies that are from a frequency corresponding to DC to a frequency corresponding to an occupied band width of an input signal inputted to the input terminal 101, the second harmonic frequency, and soon. Therefore, in the predistortion circuit, the amplitudes of each intermodulation distortion component of each order can be set to substantially coincide with each other.

Figure 5A:
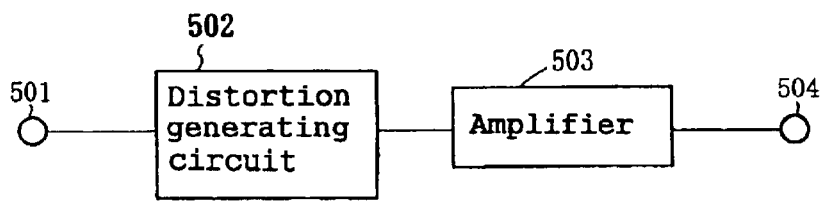
FIG. 5 is a diagram used for the explanation of the configuration and the principle of a predistortion scheme.
Figure 5B:
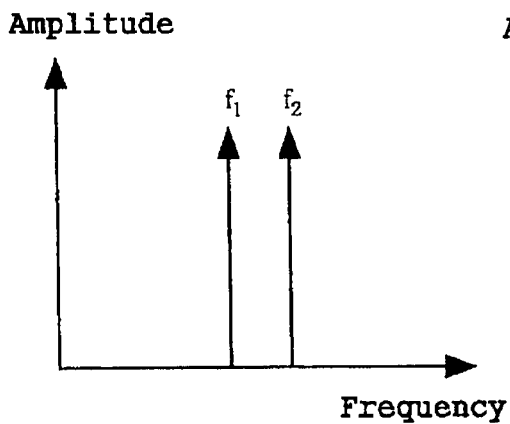
Figure 5C:
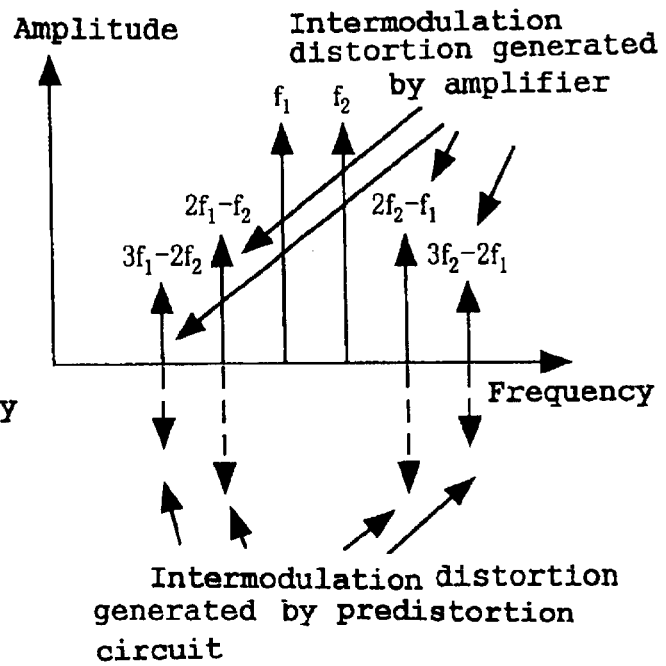
Figure 6B:
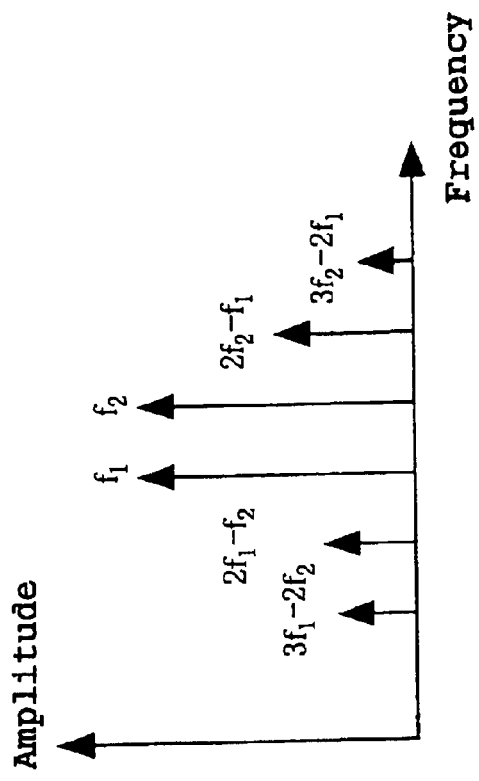
FIG. 6 is a diagram used for the explanation of the problems.
Figure 6A:
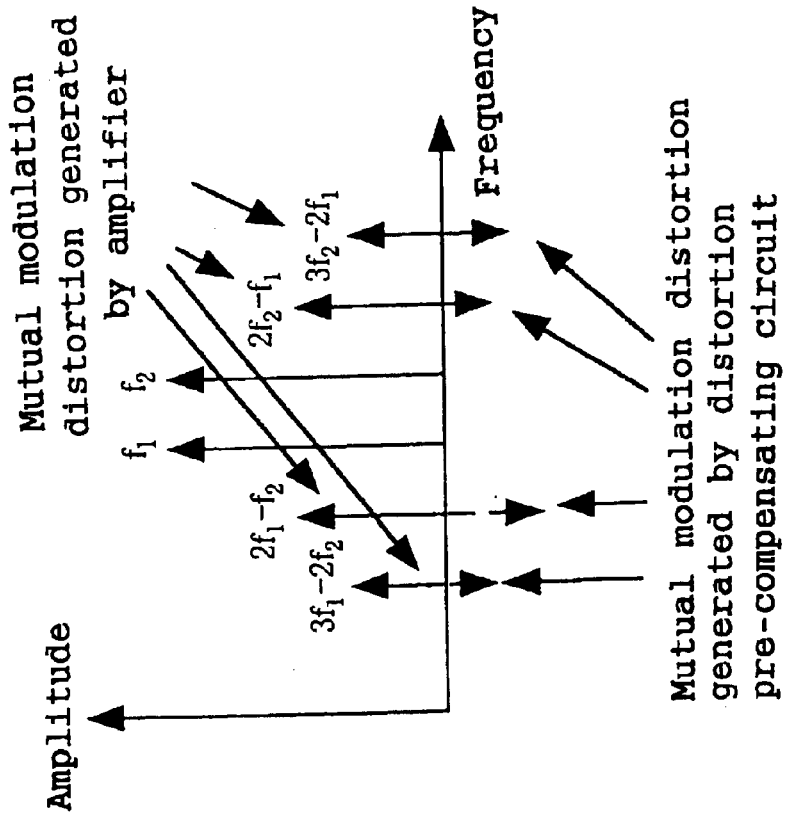

An example is described below in detail for the case of the signal having the frequencies f1, f2 shown in FIGS. 5 and 6. The specific-frequency suppressing means 108, 109 has an impedance lower than the input impedance or the output impedance of the diode 106 at frequencies f2−f1, 2f1, 2f2, thereby removing unnecessary distortion components caused by the distortion occurring at all or part of such frequencies that are from a frequency corresponding to DC to a frequency corresponding to an occupied band width of an input signal inputted to the input terminal 101 and/or the second harmonic frequency of the input signal, thereby suppressing the amplitudes of the signals of the frequencies f2−f1, 2f1, 2f2 generated by the predistortion circuit of the present embodiment. Therefore, when the amplitude of the signal input to the input terminal 101 and/or the voltage applied to the power supply terminal 103 are correctly set so that the distortion components each having the same amplitude as that of each distortion component generated by the object amplifier of the distortion compensation are output to the output terminal 102, the amplitudes of signals of each frequency 2f2−f1, 2f1−f2 substantially coincide with each other.

In the above-mentioned Embodiment 1, the diode 106 is used as an example of a nonlinear device of a predistortion circuit of the present invention. Further, the resistor 104, the power supply terminal 103, and the capacitor 105 are used as an example of a bias supplying circuit. Furthermore, the specific-frequency suppressing means 108, 109 are used as an example of specific-frequency suppressing means.

Further, the specific-frequency suppressing means 108, 109 of the above-mentioned Embodiment 1 may comprise the all or a part of a resistor, a coil, a capacitor, and a transmission line.

In the above-mentioned Embodiment 1, the specific-frequency suppressing means 108, 109 used may be specific-frequency suppressing means having an impedance lower than the input impedance or the output impedance of the diode 106 at the second harmonic frequency of the input signal. However, the specific-frequency suppressing means 108, 109 further may be specific-frequency suppressing means having an impedance lower than the input impedance or the output impedance of the diode 106 at a whole multiple, including twice, of the carrier wave frequency of the input signal.

Figure 10:
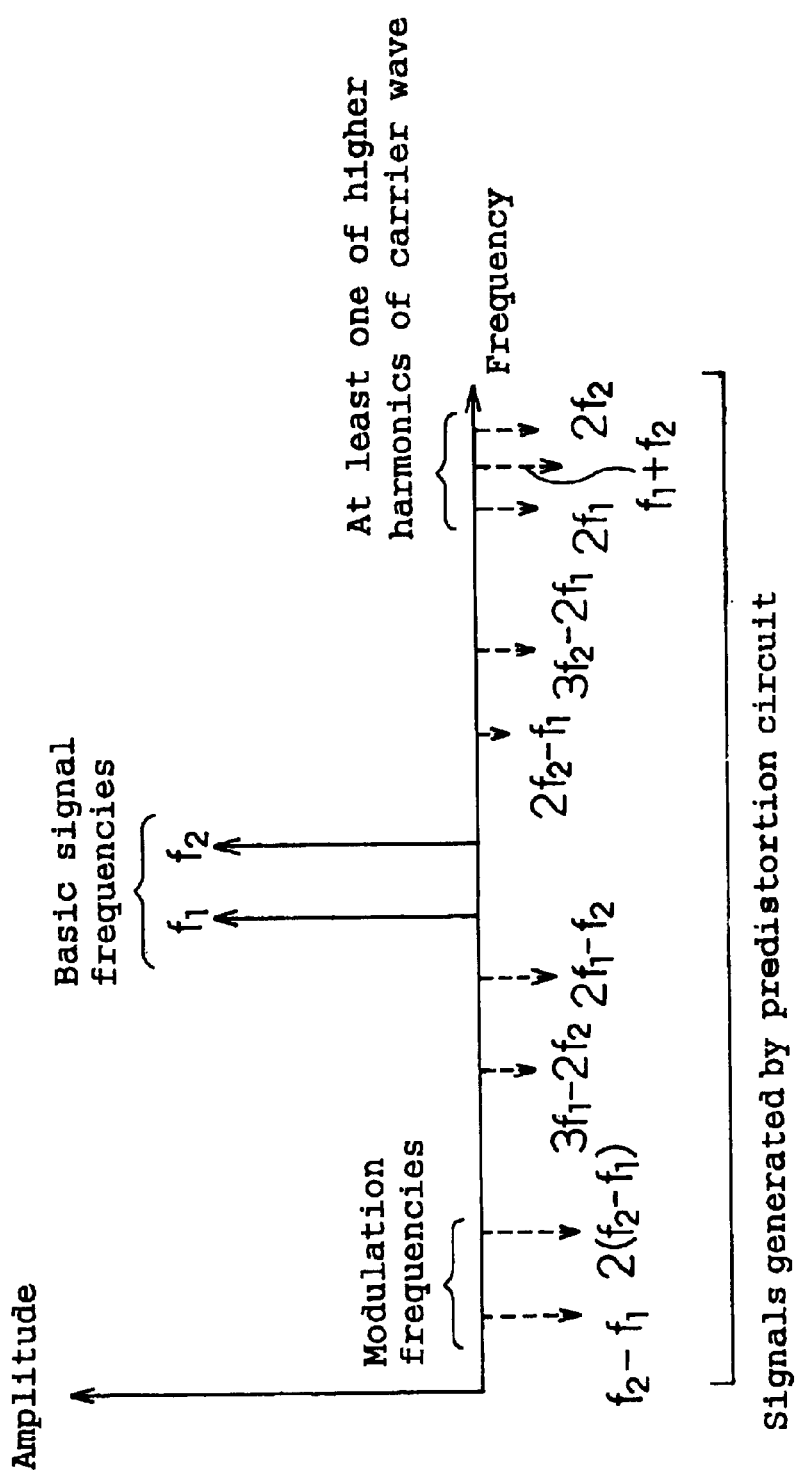
FIG. 10 is a diagram used for the explanation of the problems.

The specific-frequency suppressing means 108 used in FIG. 1 may be means of suppressing the signal components (f2−f1), 2(f2−f1) of all or part of such frequencies that are from a frequency corresponding to DC to a frequency corresponding to an occupied band width of an input signal inputted to the input terminal 101 shown in FIG. 10. Alternatively, the means used may be means of suppressing at least one of the higher harmonic signal components 2f1, 2f2, (f1+f2) of the carrier wave of the input signal. Similarly, the specific-frequency suppressing means 109 used may be means of suppressing the signal components (f2−f1), 2(f2−f1) of all or part of such frequencies that are from a frequency corresponding to DC to a frequency corresponding to an occupied band width of an input signal inputted to the input terminal 101. Alternatively, the means used may be means of suppressing at least one of the higher harmonic signal components 2f1, 2f2, (f1+f2) of the carrier wave of the input signal.

Figure 11:
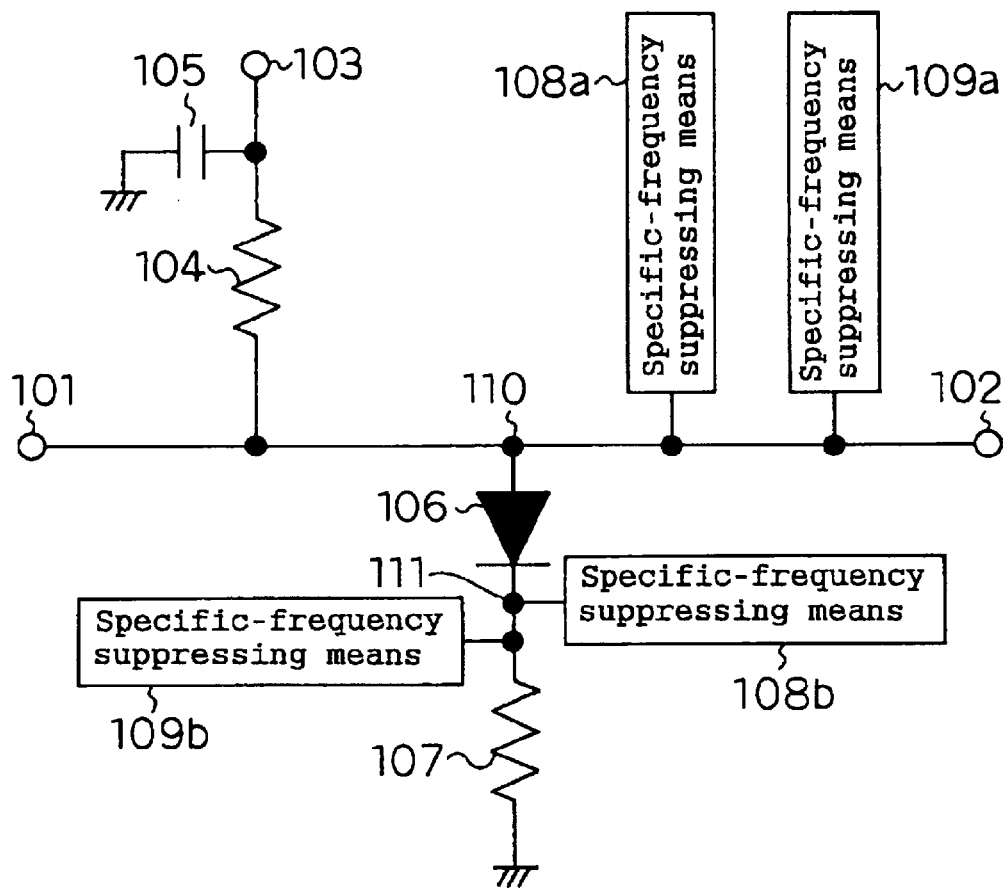
FIG. 11 is a configuration diagram of a predistortion circuit of Embodiment 1 of the present invention.
Figure 11:
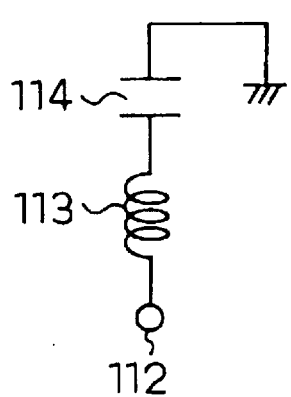
Figure 11:
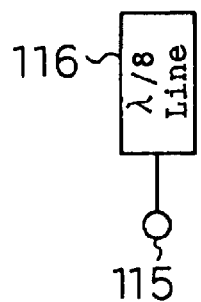
Figure 11:
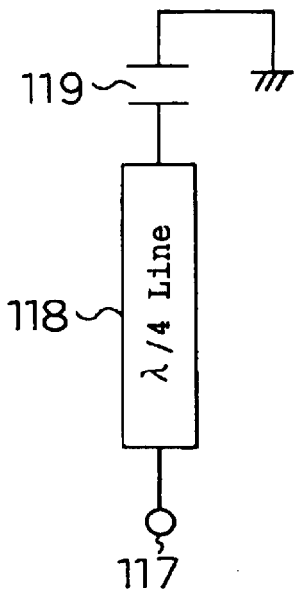

Further, as shown in FIG. 11, it is possible that both specific-frequency suppressing means 108a of suppressing the signal components (f2−f1), 2(f2−f1) of all or part of such frequencies that are from a frequency corresponding to DC to a frequency corresponding to an occupied band width of an input signal inputted to the input terminal 101 and specific-frequency suppressing means 109a of suppressing at least one of the higher harmonic signal components 2f1, 2f2, (f1+f2) of the carrier wave of the input signal are provided between the connection point 110 and the output terminal 102 and that both specific-frequency suppressing means 108b of suppressing the signal components (f2−f1), 2(f2−f1) of all or part of such frequencies that are from a frequency corresponding to DC to a frequency corresponding to an occupied band width of an input signal inputted to the input terminal 101 and specific-frequency suppressing means 109b of suppressing at least one of the higher harmonic signal components 2f1, 2f2, (f1+f2) of the carrier wave of the input signal are provided between the diode 106 and the resistor 107.

Here, it is possible to provide both the specific-frequency suppressing means 108a and the specific-frequency suppressing means 109a and not to provide both the specific-frequency suppressing means 108b and the specific-frequency suppressing means 109b. Alternatively, it is possible to provide both the specific-frequency suppressing means 108b and the specific-frequency suppressing means 109b and not to provide both the specific-frequency suppressing means 108a and the specific-frequency suppressing means 109a. In short, it is sufficient to provide specific-frequency suppressing means connected to one side or both sides of the nonlinear device directly without another intervening device and of suppressing all or part of such frequencies that are from a frequency corresponding to DC to a frequency corresponding to an occupied band width of an input signal inputted to the input terminal and/or at least one higher harmonic frequency of the carrier wave of the input signal.

Further, the description has been made for the case of the input signal consisting of two distinct frequencies. However, a similar effect is obtained even for the case of a modulated signal.

Furthermore, in the above-mentioned Embodiment 1, the example of a bias supplying circuit is composed of the resistor 104, the power supply terminal 103, and the capacitor 105. However, the resistor 104 may be replaced by a λ/4 line. In that case, the bias supplying circuit serves as specific-frequency suppressing means.

(Embodiment 2)

A predistortion circuit of Embodiment 2 of the present invention is described below with reference to FIG. 2. FIG. 2(a) is a configuration diagram of the predistortion circuit of Embodiment 2 of the present invention. As shown in FIG. 2(a), specific-frequency suppressing means 209 having an impedance lower than the output impedance of a diode 206 at all or part of such frequencies that are from a frequency corresponding to DC to a frequency corresponding to an occupied band width of an input signal inputted to the input terminal 201 is connected to a connection point 211 between the diode 206 and an output terminal 202. Further, specific-frequency suppressing means 208 having an impedance lower than the input impedance of the diode 206 at the all or part of such frequencies that are from a frequency corresponding to DC to a frequency corresponding to an occupied band width of an input signal inputted to the input terminal 201 is connected to a connection point 210 between the diode 206 and a resistor 204.

Alternatively, it is possible that specific-frequency suppressing means 209 having an impedance lower than the output impedance of a diode 206 at the second harmonic frequency of the input signal is connected to the connection point 211 between the diode 206 and the output terminal 202 and that specific-frequency suppressing means 208 having an impedance lower than the input impedance of the diode 206 at the second harmonic frequency of the input signal is connected to the connection point 210 between the diode 206 and the resistor 204.

Further alternatively, it is possible that specific-frequency suppressing means 209 having an impedance lower than the output impedance of a diode 206 at both all or part of such frequencies that are from a frequency corresponding to DC to a frequency corresponding to an occupied band width of an input signal inputted to the input terminal 201 and second harmonic frequency of the input signal is connected to the connection point 211 between the diode 206 and the output terminal 202 and that specific-frequency suppressing means 208 having an impedance lower than the input impedance of the diode 206 at both all or part of such frequencies that are from a frequency corresponding to DC to a frequency corresponding to an occupied band width of an input signal inputted to the input terminal 201 and the second harmonic frequency of the input signal is connected to the connection point 210 between the diode 206 and the resistor 204.

Furthermore, it is possible that only one of the specific-frequency suppressing means 208, 209 is connected to the diode 206.

In Embodiment 2 of the present invention, each specific-frequency suppressing means 208, 209 is used as an example of the specific-frequency suppressing means of a predistortion circuit of the present invention. Each specific-frequency suppressing means 208, 209 is means of suppressing the signal components (f2−f1) of the differential frequencies of the input signal, 2(f2−f1) of the higher harmonics of it and suppressing at least one of the higher harmonic signal components 2f1, 2f2, (f1+f2) and so on of the carrier wave of the input signal as shown in FIG. 10.

Figure 2:
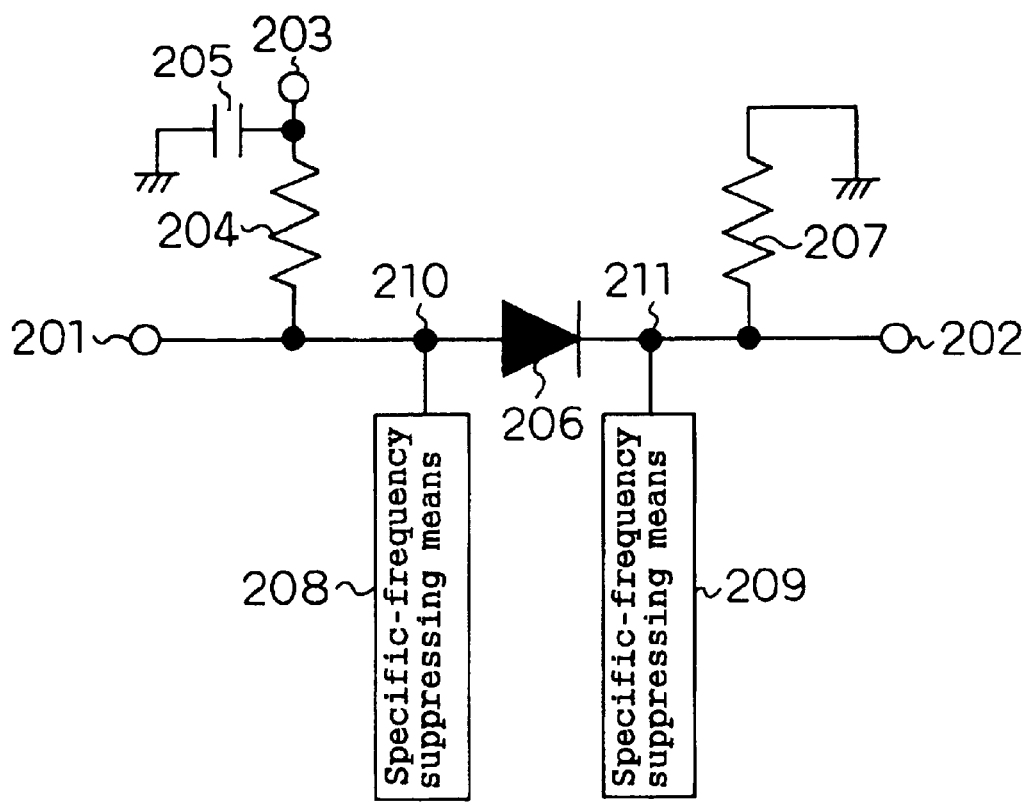
FIG. 2 is a configuration diagram of a predistortion circuit of Embodiment 2 of the present invention.
Figure 2:
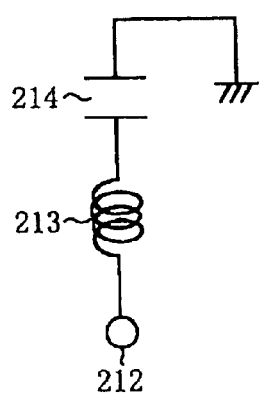
Figure 2:
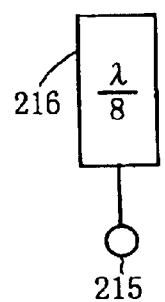
Figure 2:
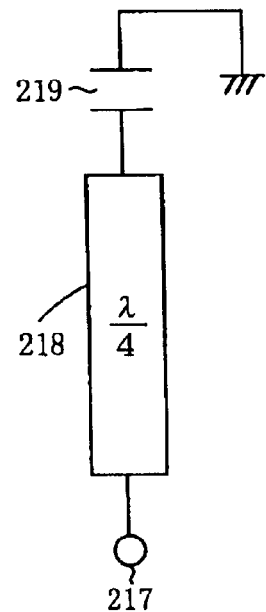

FIG. 2(*b*) is a diagram showing an example of configuration in which each specific-frequency suppressing means 208, 209 is composed of lumped parameter components. In this example, the means is a serial LC resonance circuit composed of a coil 213 and a capacitor 214 interconnected in series. A connection terminal 212 is connected to the connection point 210, 211. The components values of the coil 213 and the capacitor 214 are selected such that the resonance frequency of the serial LC resonance circuit corresponds to all or part of such frequencies that are from a frequency corresponding to DC to a frequency corresponding to an occupied band width of an input signal inputted to the input terminal 201. Alternatively, the components values of the coil 213 and the capacitor 214 are selected such that the resonance frequency of the serial LC resonance circuit corresponds to the second harmonic frequency of the input signal.

FIG. 2(*c*) is a diagram showing an example of configuration in which each specific-frequency suppressing means 208, 209 is composed of a transmission line. In this example, the means is an open stub consisting of a λ/8 line 216. A connection terminal 215 is connected to the connection point 210, 211. The line length of the λ/8 line 216 is designed with λ being the wavelength of the carrier wave. Then, the circuit has a low impedance at frequencies 2f1, 2f2, f1+f2, thereby suppressing these signals.

FIG. 2(*d*) is a diagram showing an example of configuration in which each specific-frequency suppressing means 208, 209 is composed of a transmission line and a capacitor. In this example, the means is a stub matching circuit consisting of a λ/4 line 218 and a capacitor 219 interconnected in series. A connection terminal 217 is connected to the connection point 210, 211. The line length of the λ/4 line 218 is designed with λ being the wavelength of the carrier wave. The capacitor 219 connected to the λ/4 line 218 is selected so as to result in an impedance lower enough at all or part of such frequencies that are from a frequency corresponding to DC to a frequency corresponding to an occupied band width of an input signal inputted to the input terminal 201. Alternatively, the capacitor 219 connected to the λ/4 line 218 is selected so as to result in an impedance lower enough at the second harmonic frequency of the input signal. Further alternatively, the capacitor 219 connected to the λ/4 line 218 is selected so as to result in an impedance lower enough at all or part of such frequencies that are from a frequency corresponding to DC to a frequency corresponding to an occupied bandwidth of an input signal inputted to the input terminal 201 and the second harmonic wave frequency of the input signal. As such, in FIG. 2(*d*), the impedance viewed from the connection terminal 217 is lower than the input (output) impedance of the diode 206 at all or part of such frequencies that are from a frequency corresponding to DC to a frequency corresponding to an occupied band width of an input signal inputted to the input terminal and/or at least one higher harmonic frequency of a carrier wave of the input signal.

As such, the predistortion circuit avoids the occurrence of unnecessary distortion components caused by the distortion occurring at all or part of such frequencies that are from a frequency corresponding to DC to a frequency corresponding to an occupied band width of an input signal inputted to the input terminal 201 or the second harmonic frequency. Therefore, in the predistortion circuit, when the amplitude of the signal input to the input terminal 201 and/or the voltage applied to the power supply terminal 203 are set so that the distortion components each having the same amplitude as that of each distortion component generated by the object amplifier of the distortion compensation are output to the output terminal 202, the amplitudes of each intermodulation distortion component of each order can be set to substantially coincide with each other.

In the above-mentioned Embodiment 2, the diode 206 is used as an example of a nonlinear device of a predistortion circuit of the present invention. Further, the resistor 204, the power supply terminal 203, and the capacitor 205 are used as an example of a bias supplying circuit. Furthermore, the specific-frequency suppressing means 208, 209 are used as an example of specific-frequency suppressing means.

In the above-mentioned Embodiment 2, the specific-frequency suppressing means 208, 209 used may be specific-frequency suppressing means having an impedance lower than the input impedance or the output impedance of the diode 206 at the second harmonic frequency of the input signal. However, the specific-frequency suppressing means 208, 209 further may be specific-frequency suppressing means having an impedance lower than the input impedance or the output impedance of the diode 206 at a whole multiple, including twice, of the carrier wave frequency of the input signal.

Further, the description has been made for the case of the input signal consisting of two distinct frequencies. However, a similar effect is obtained even for the case of a modulated signal.

(Embodiment 3)

Figure 3:
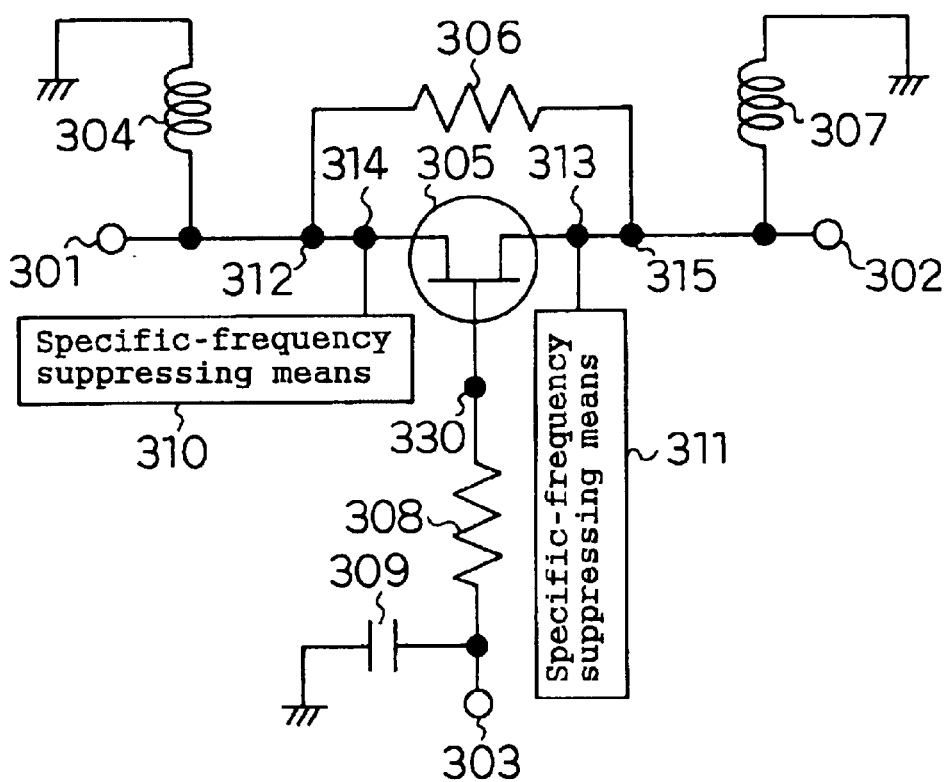
FIG. 3 is a configuration diagram of a predistortion circuit of Embodiment 3 of the present invention.
Figure 3:
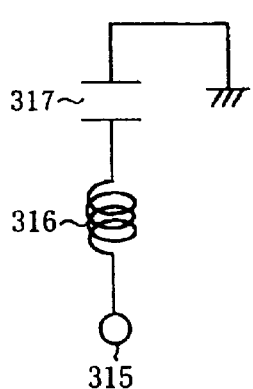
Figure 3:
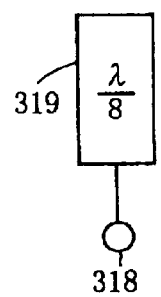
Figure 3:
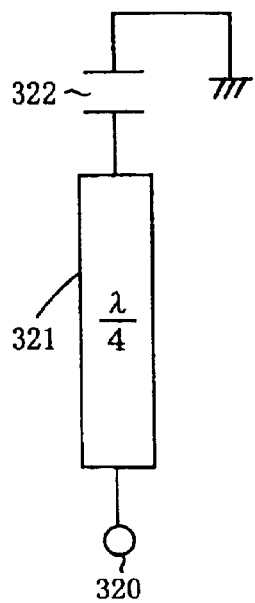

A predistortion circuit of Embodiment 3 of the present invention is described below with reference to FIG. 3. FIG. 3(*a*) is a configuration diagram of the predistortion circuit of Embodiment 3 of the present invention. As shown in FIG. 3(*a*) specific-frequency suppressing means 311 having an impedance lower than the output impedance of a transistor 305 at all or part of such frequencies that are from a frequency corresponding to DC to a frequency corresponding to an occupied band width of an input signal inputted to the input terminal 301 at is connected to a connection point 313 between the transistor 305 and an output terminal 302. Further, specific-frequency suppressing means 310 having an impedance lower than the input impedance of the transistor 305 at all or part of such frequencies that are from a frequency corresponding to DC to a frequency corresponding to an occupied band width of an input signal inputted to the input terminal 301 is connected to a connection point 314 between the transistor 305 and a input terminal 301.

Alternatively, it is possible that specific-frequency suppressing means 311 having an impedance lower than the output impedance of a transistor 305 at the second harmonic frequency of the input signal is connected to the connection point 313 between the transistor 305 and the output terminal 302 and that specific-frequency suppressing means 310 having an impedance lower than the input impedance of the transistor 305 at the second harmonic frequency of the input signal is connected to the connection point 314 between the transistor 305 and the input terminal 310.

Further alternatively, it is possible that specific-frequency suppressing means 311 having an impedance lower than the output impedance of a transistor 305 at both all or part of such frequencies that are from a frequency corresponding to DC to a frequency corresponding to an occupied band width of an input signal inputted to the input terminal 301 and the second harmonic frequency of the input signal is connected to the connection point 313 between the transistor 305 and the output terminal 302 and that specific-frequency suppressing means 310 having an impedance lower than the input impedance of the transistor 305 at both all or part of such frequencies that are from a frequency corresponding to DC to a frequency corresponding to an occupied band width of an input signal inputted to said input terminal 301 and the second harmonic frequency of the input signal is connected to the connection point 314 between the transistor 305 and the input terminal 301.

Furthermore, it is possible that only one of the specific-frequency suppressing means 310, 311 is connected to the transistor 305. Further, a resistor 306 connected to the connection point 312, 315 maybe a coil, a capacitor, or a passive circuit comprising a resistor, a coil, and a capacitor.

In Embodiment 3 of the present invention, each specific-frequency suppressing means 310, 311 is used as an example of the specific-frequency suppressing means of a predistortion circuit of the present invention. Each specific-frequency suppressing means 310, 311 is means of suppressing the signal components (f2−f1) of the differential frequencies of the input signal, 2(f2−f1) of the higher harmonics of it and suppressing at least one of the higher harmonic signal components 2f1, 2f2, (f1+f2) and so on of the carrier wave of the input signal as shown in FIG. 10.

FIG. 3(b) is a diagram showing an example of configuration in which each specific-frequency suppressing means 310, 311 is composed of lumped parameter components. In this example, the means is a serial LC resonance circuit composed of a coil 316 and a capacitor 317 interconnected in series. A connection terminal 315 is connected to the connection point 313, 314. The components values of the coil 316 and the capacitor 317 are selected such that the resonance frequency of the serial LC resonance circuit corresponds to all or part of such frequencies that are from a frequency corresponding to DC to a frequency corresponding to an occupied bandwidth of an input signal inputted to the input terminal 301. Alternatively, the components values of the coil 316 and the capacitor 317 are selected such that the resonance frequency of the serial LC resonance circuit corresponds to the second harmonic frequency of the input signal.

FIG. 3(c) is a diagram showing an example of configuration in which each specific-frequency suppressing means 310, 311 is composed of a transmission line. In this example, the means is an open stub consisting of a λ/8 line 319. A connection terminal 318 is connected to the connection point 313, 314. The line length of the λ/8 line 319 is designed so as to be λ/8 at the basic frequency of the input signal. Then, the circuit has a low impedance at frequencies 2f1, 2f2, f1+f2, thereby suppressing these signals.

FIG. 3(d) is a diagram showing an example of configuration in which each specific-frequency suppressing means 310, 311 is composed of a transmission line and a capacitor. In this example, the means is a stub matching circuit consisting of a λ/4 line 321 and a capacitor 322 interconnected in series. A connection terminal 320 is connected to the connection point 313, 314. The line length of the λ/4 line 321 is designed so as to be λ/4 at the basic frequency of the input signal. The capacitor 322 connected to the λ/4 line 321 is selected so as to result in a low impedance at all or part of such frequencies that are from a frequency corresponding to DC to a frequency corresponding to an occupied bandwidth of an input signal inputted to the input terminal 301. Alternatively, the capacitor 322 connected to the λ/4 line 321 is selected so as to result in a low impedance at the second harmonic frequency of the input signal. Further alternatively, the capacitor 322 connected to the λ/4 line 321 is selected so as to result in a low impedance at all or part of such frequencies that are from a frequency corresponding to DC to a frequency corresponding to an occupied band width of an input signal inputted to the input terminal 301 and the second harmonic frequency of the input signal. In short, it is sufficient that the overall impedance of the λ/4 line 321 and the capacitor 322 is lower than the impedance of the transistor 305.

As such, the predistortion circuit avoids the occurrence of unnecessary distortion components caused by the distortion occurring at all or part of such frequencies that are from a frequency corresponding to DC to a frequency corresponding to an occupied band width of an input signal inputted to the input terminal 301 or at the second harmonic frequency. Therefore, in the predistortion circuit, when the amplitude of the signal input to the input terminal 301 and/or the voltage applied to the power supply terminal 303 are set so that the distortion components each having the same amplitude as that of each distortion component generated by the object amplifier of the distortion compensation are output to the output terminal 302, the amplitudes of each intermodulation distortion component of each order can be set to substantially coincide with each other.

In the above-mentioned Embodiment 3, the transistor 305 is used as an example of a nonlinear device of a predistortion circuit of the present invention. Further, the resistor 308, the power supply terminal 303, and the capacitor 309 are used as an example of a bias supplying circuit. Furthermore, the specific-frequency suppressing means 310, 311 are used as an example of specific-frequency suppressing means.

In FIG. 3(a), each specific-frequency suppressing means 310, 311 is connected to the connection point 313, 314. However, even when specific-frequency suppressing means is connected to the connection point 330 between the gate of the transistor 305 and a resistor 308, the circuit suppresses all or part of such frequencies that are from a frequency corresponding to DC to a frequency corresponding to an occupied band width of an input signal inputted to the input terminal 301 and/or suppresses at least one higher harmonic frequency of the carrier wave of the input signal.

Further, the description has been made for the case of the input signal consisting of two distinct frequencies. However, a similar effect is obtained even for the case of a modulated signal.

Specific examples of a predistortion circuit using a diode as a nonlinear device in accordance with an embodiment of the present invention other than the above-mentioned Embodiments 1 to 3 is described below with reference to FIGS. 4, 7, and 8.

Figure 4:
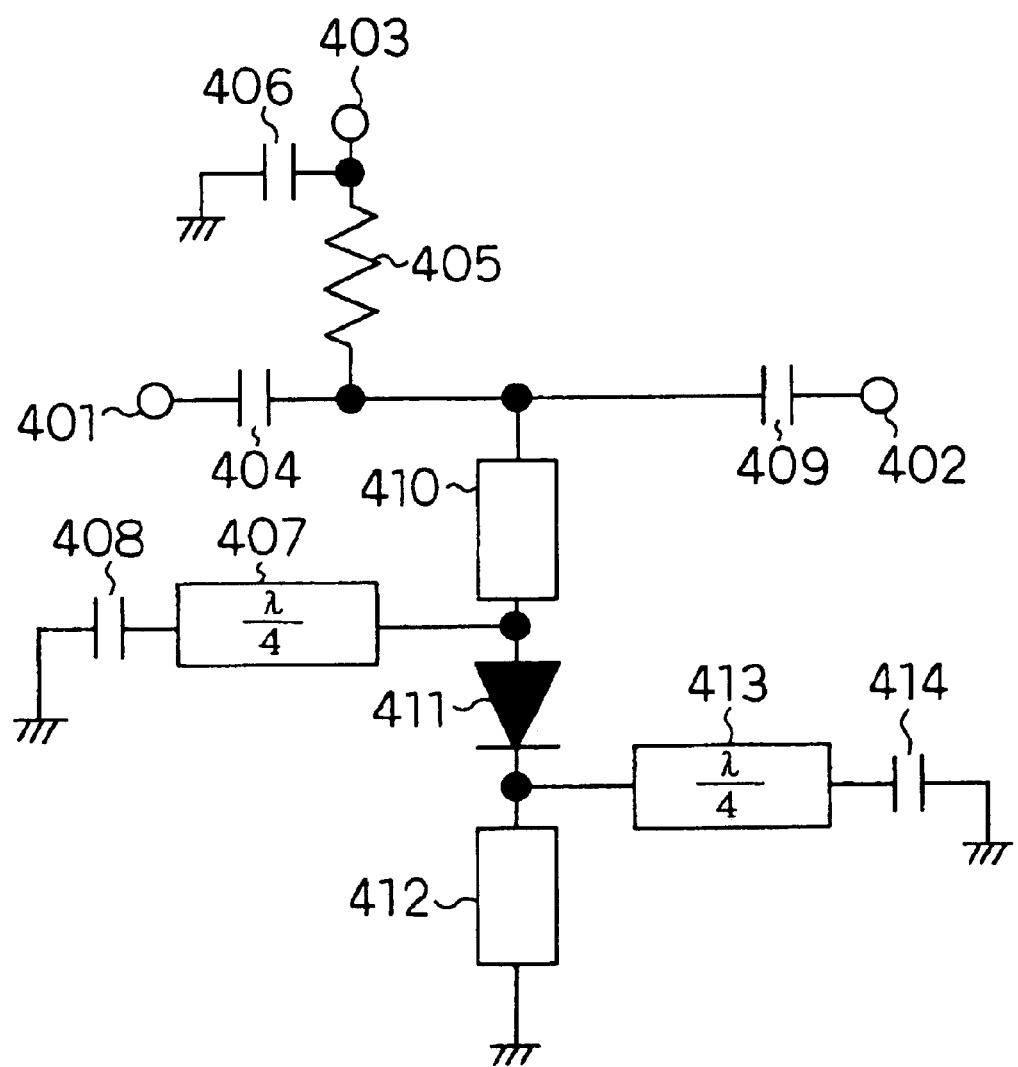
FIG. 4 is a configuration diagram of a predistortion circuit of an alternative embodiment of the present invention.

FIG. 4 shows an example in which each lumped parameter components 410, 412, such as a resistor, a coil, and a capacitor, is connected to the anode and the cathode of a diode 411. Here, each lumped parameter components 410, 412, such as a resistor, a coil, and a capacitor, may be replaced by a passive circuit comprising a lumped parameter component such as a resistor, a coil, and a capacitor.

Figure 7:
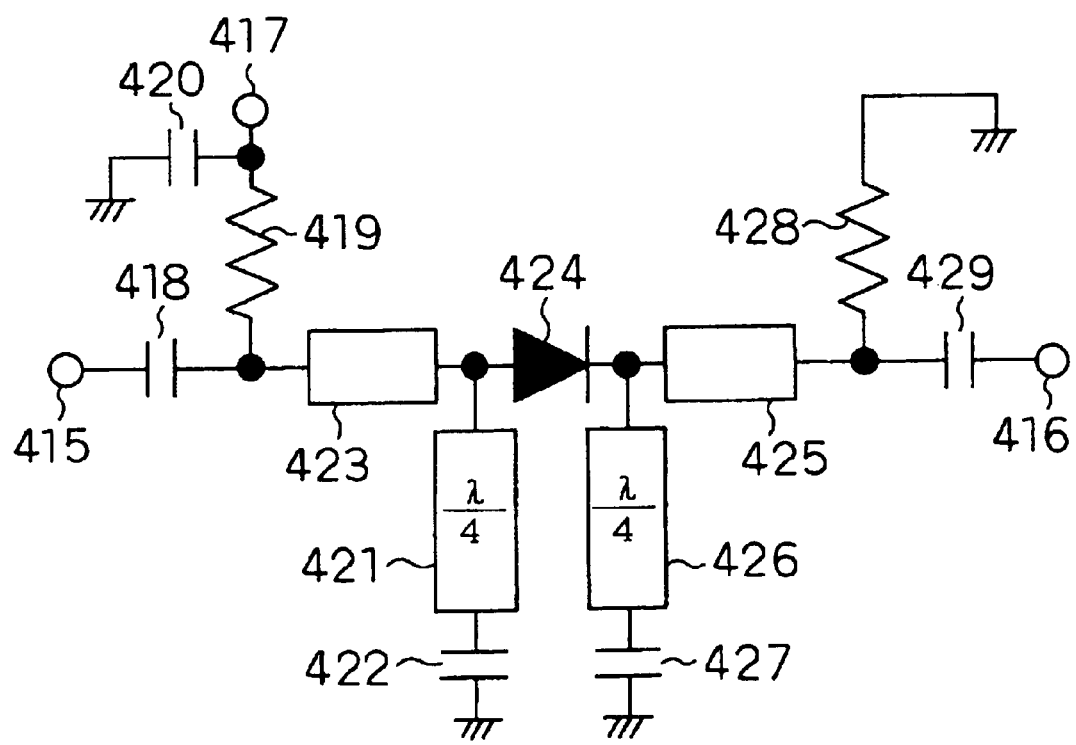
FIG. 7 is a configuration diagram of a predistortion circuit of an alternative embodiment of the present invention.

FIG. 7 shows an example in which each lumped parameter components 423, 425, such as a resistor, a coil, and a capacitor, is connected to the anode and the cathode of a diode 424. Here, each lumped parameter components 423, 425, such as a resistor, a coil, and a capacitor, may be replaced by a passive circuit comprising a lumped parameter component such as a resistor, a coil, and a capacitor.

Figure 8:
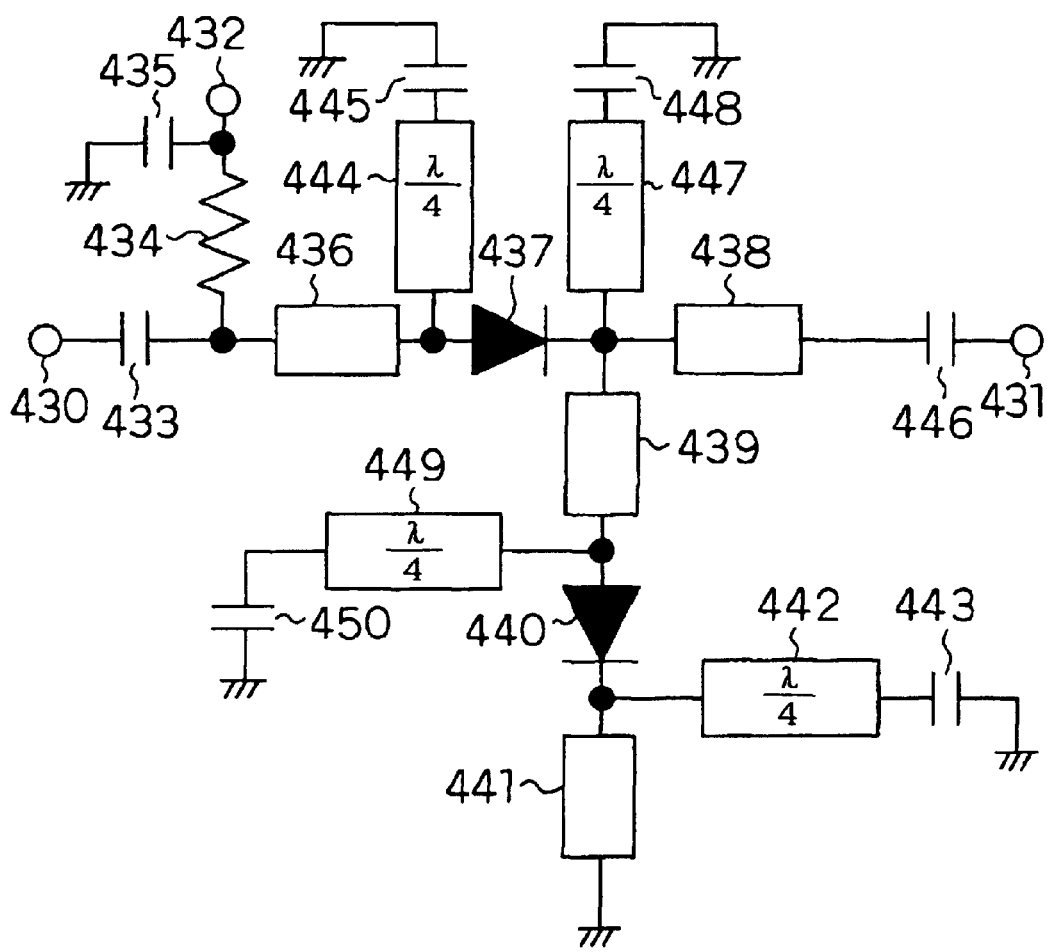
FIG. 8 is a configuration diagram of a predistortion circuit of an alternative embodiment of the present invention.
Figure 9:
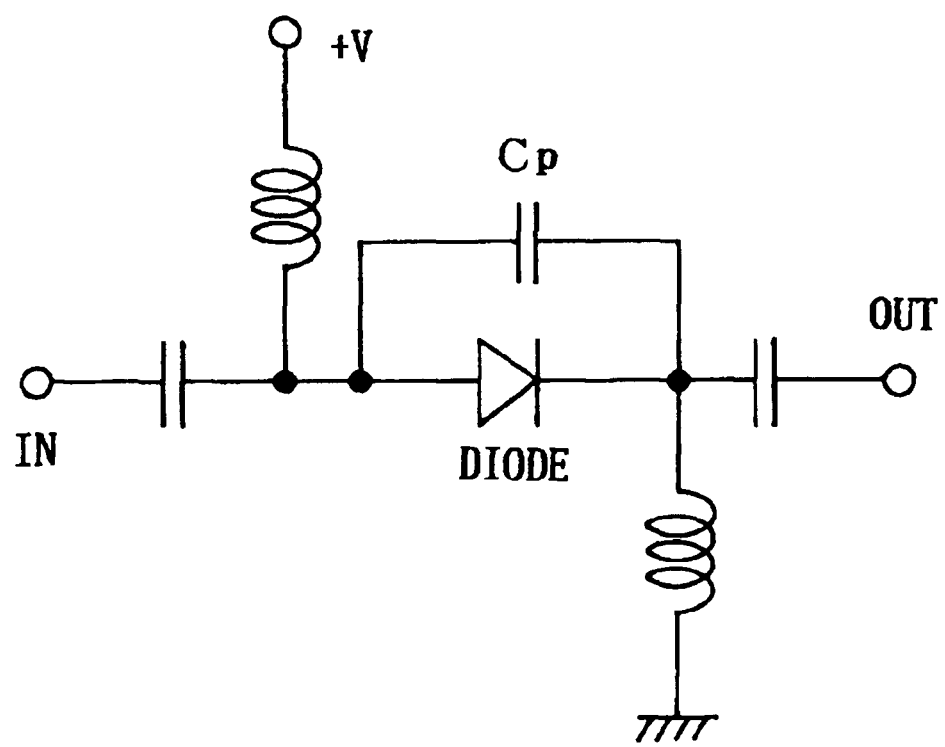
FIG. 9 is a configuration diagram of a predistortion circuit of the prior art.

FIG. 8 shows an example of circuit configuration in which two diodes 437, 440 are used in combination. More than two diodes may be used.

In each predistortion circuit shown in the above-mentioned FIGS. 4, 7, and 8, the specific-frequency suppressing means has an impedance lower than the input impedance or the output impedance of the diode. Accordingly, in each predistortion circuit, the amplitudes of each intermodulation distortion component of each order can be set to substantially coincide with each other.

Figure 12A:
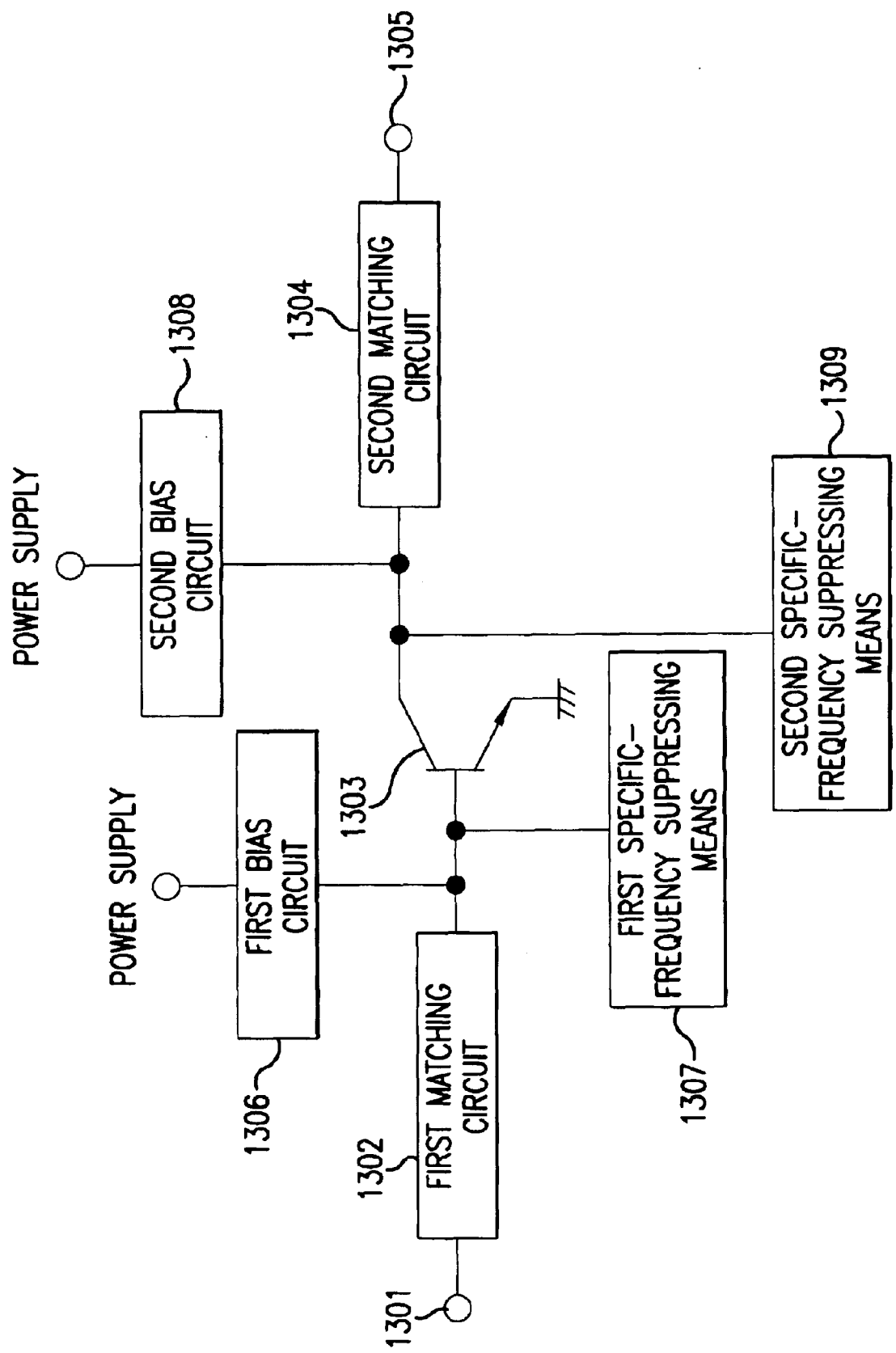
FIG. 12 is a configuration diagram of an amplifier of an embodiment of the present invention.
Figure 12B:
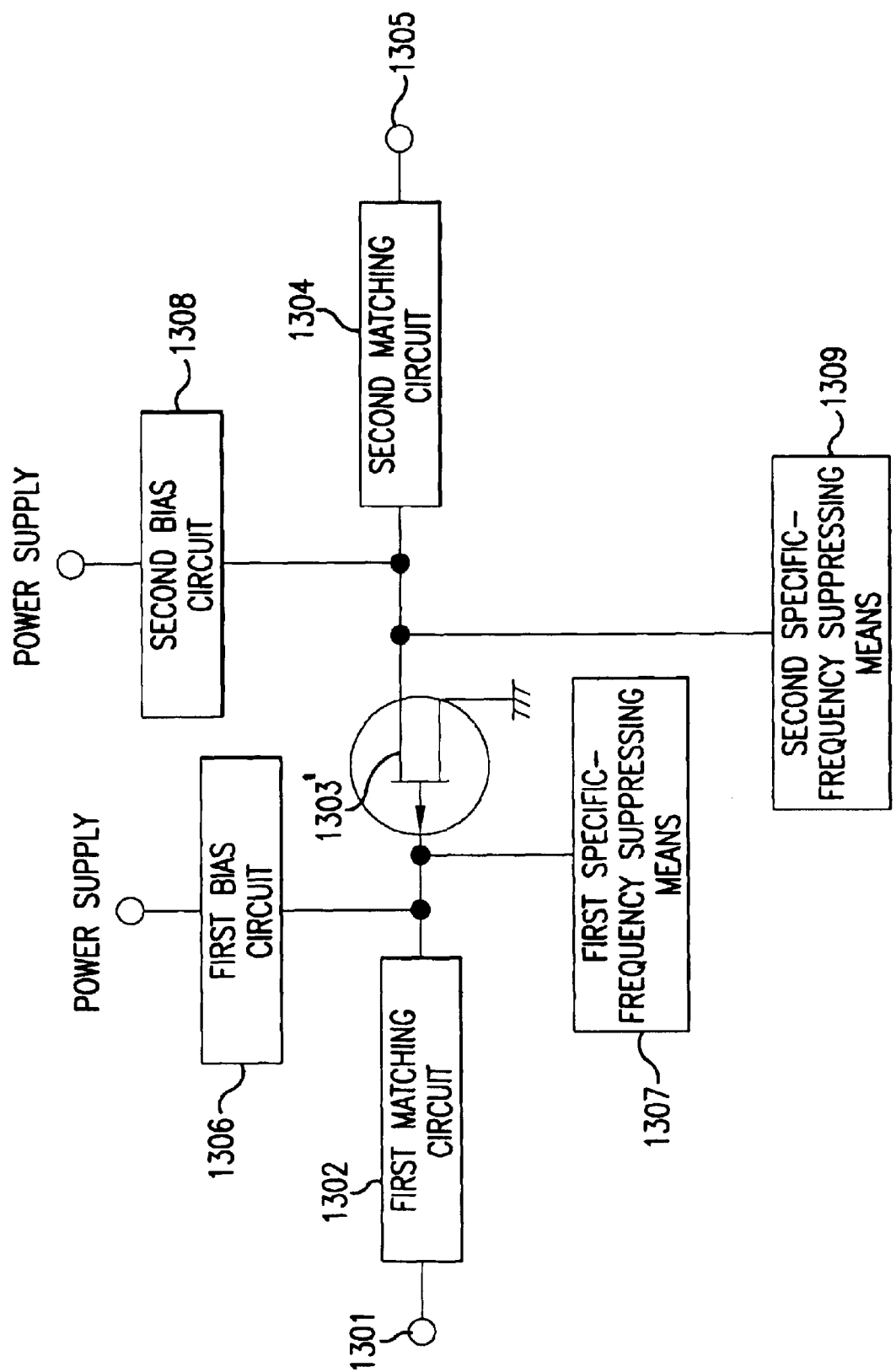

The scope of the present invention includes a power amplifier comprising: a predistortion circuit described in each above-mentioned embodiment; and an amplifier for amplifying the signal from the predistortion circuit. An example of such an amplifier is shown in FIGS. 12a and 12b. FIG. 12a describes an amplifier with a bipolar transistor 1303, and FIG. 12b replaces the bipolar transistor 1303 with a field-effect transistor (FET) 1303'.

The power amplifier input signal composed of an input terminal 1301 for inputting a signal; a first matching circuit 1302 connected to the input terminal 1301; a transistor 1303, (1303') the gate of which is connected to the first matching circuit 1302; a second matching circuit 1304 connected to the drain of the transistor 1303, (1303'); an output terminal 1305 connected to the second matching circuit 1304 and for outputting a signal; a first bias circuit 1306 connected between the first matching circuit 1302 and the transistor 1030, (1303'), first specific-frequency suppressing means 1307 connected between the first bias circuit 1306 and the transistor 1303, (1303') and of suppressing all or part of such frequencies that are from a frequency corresponding to DC to a frequency corresponding to an occupied band width of an input signal inputted to the input terminal and/or at least one higher harmonic frequency of the carrier wave of the input signal; a second bias circuit 1308 connected between the second matching circuit 1304 and the transistor 1303, (1303'); and second specific-frequency suppressing means 1309 connected between the second bias circuit 1308 and the transistor 1303, (1303') and of suppressing all or part of such frequencies that are from a frequency corresponding to DC to a frequency corresponding to an occupied band width of an input signal inputted to input terminal and/or at least one higher harmonic frequency of the carrier wave of the input signal.

Figure 13:
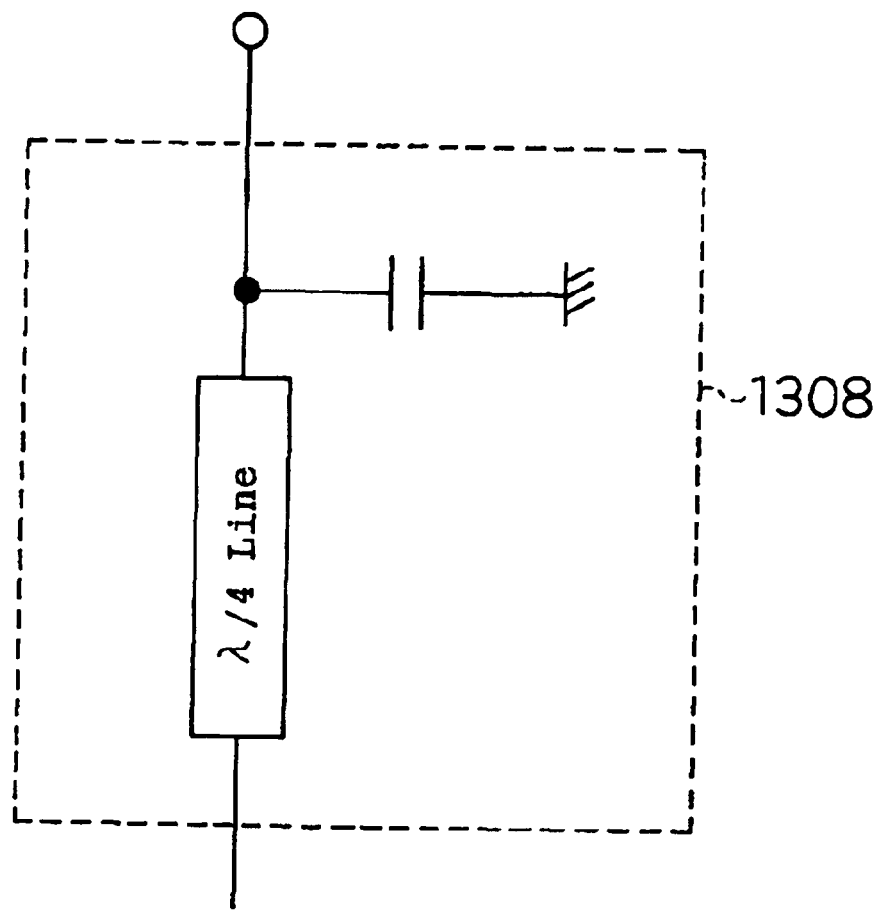
FIG. 13 is a diagram showing an example of a second bias circuit 1308.

As shown in FIGS. 12a and 12b, the input side and/or the output side of the transistor 1303, (1303') are provided with specific-frequency suppressing means 1307, 1309 of suppressing all or part of such frequencies that are from a frequency corresponding to DC to a frequency corresponding to an occupied band width of an input signal inputted to the input terminal and/or at least one higher harmonic frequency of the carrier wave of the input signal, whereby the unbalance of distortion in the signal generated by the amplifier can also be suppressed. Accordingly, an amplifier shown in FIGS. 12a and 12b enhance the effect of suppressing the overall unbalance of distortion in the signal of a power amplifier. Here, the second bias circuit 1308 may be the circuit shown in FIG. 13. When the second bias circuit 1308 is the circuit shown in FIG. 13, the second bias circuit 1308 serves as a specific-frequency suppressing means.

As is obviously understood from the above-mentioned description, the present invention provides a predistortion circuit for generating the intermodulation distortion components capable of substantially canceling the intermodulation distortion components generated by an amplifier.

What is claimed is:

1. A predistortion circuit comprising:
    an input terminal for inputting a predetermined signal;
    a nonlinear device directly or indirectly connected to said input terminal;
    a bias supply circuit for applying a voltage to said nonlinear device;
    specific-frequency suppressing means connected to one side or both sides of said nonlinear device directly without another intervening device, said specific-frequency suppressing means suppressing all or part of such frequencies that are from a frequency corresponding to DC to a frequency corresponding to an occupied band width of an input signal inputted to said input terminal; and
    an output terminal for outputting a signal;
    wherein said nonlinear device comprises a diode.

2. A predistortion circuit of any one of claims 1, 13 and 14, wherein said specific-frequency suppressing means has such impedance that the impedance of said specific-frequency suppressing means viewed from the connection point to which said specific-frequency suppressing means is connected is lower than the impedance of said nonlinear device viewed from said connection point at all or part of such frequencies that are from said frequency corresponding to DC to said frequency corresponding to said occupied band width.

3. A predistortion circuit of any one of claims 1, 13, 14 and 15, wherein said nonlinear device is provided between the connection point between said input terminal and said output terminal and the ground.

4. A predistortion circuit of any one of claims 1, 13, 14, and 15, wherein said nonlinear device is connected between said input terminal and said output terminal.

5. A predistortion circuit of any one of claims 1, 13, 14, and 15, wherein:
    said nonlinear device is a transistor;
    said input terminal is connected to any one of the drain and the source of the transistor;
    said output terminal is connected to the other of the drain and the source of said transitor; and
    said bias supply circuit is connected to the gate of said transistor.

6. A predistortion circuit of claim 15, wherein said specific-frequency suppressing means comprises all or part of a resistor, a coil, a capacitor, and transmission line.

7. A predistortion circuit of claim 15, wherein said nonlinear device comprises a diode.

8. A predistortion circuit of any one of claims 1, 13, 14, and 15 wherein said nonlinear device comprises a transistor.

9. A power amplifier comprising:
    a predistortion circuit of any one of claims 1, 13, 14, and 15; and an amplifier for amplifying the signal from said predistortion circuit.

10. A power amplifier of claim 9, wherein said amplifier comprises:
    an input terminal for inputting a signal;
    a first matching circuit connected to said input terminal;
    a transistor the gate of which is connected to said first matching circuit;
    a second matching circuit connected to the drain of said transistor;
    an output terminal connected to said second matching circuit and for outputting a signal;
    a first bias circuit connected between said first matching circuit and said transistor;
    a second bias circuit connected between said second matching circuit and said transistor; and
    specific-frequency suppressing means connected to one side or both sides of said transistor directly without another intervening device, said specific-frequency suppressing means suppressing all or part of such frequencies that are from a frequency corresponding to DC to a frequency corresponding to an occupied band width of an input signal inputted to said input terminal and/or suppressing at least one higher harmonic frequency of a carrier wave of said input signal.

11. A power amplifier of claim 9, wherein said amplifier comprises:
    an input terminal for inputting a signal;
    a first matching circuit connected to said input terminal;

a transistor the base of which is connected to said first matching circuit;

a second matching circuit connected to the collector of said transistor;

an output terminal connected to said second matching circuit and for outputting a signal;

a first bias circuit connected between said first matching circuit and said transistor;

a second bias circuit connected between said second matching circuit and said transistor; and specific-frequency suppressing means connected to one side or both sides of said transistor directly without another intervening device, said specific-frequency suppressing means suppressing all or part of such frequencies that are from a frequency corresponding to DC to a frequency corresponding to an occupied band width of an input signal inputted to said input terminal and/or suppressing at least one higher harmonic frequency of a carrier wave of said input signal.

12. A predistortion circuit of claim 1, wherein said specific-frequency suppressing means is composed of lumped parameter components interconnected in series.

13. A predistortion circuit, comprising:

an input terminal for inputting a predetermined signal;

a nonlinear device directly or indirectly connected to said input terminal;

a bias supply circuit for applying a voltage to said nonlinear device;

specific-frequency suppressing means connected to one side or both sides of said nonlinear device directly without another intervening device, said specific-frequency suppressing means suppressing all or part of such frequencies that are from a frequency corresponding to DC to a frequency corresponding to an occupied band width of an input signal inputted to said input terminal; and an output terminal for outputting a signal wherein said specific-frequency suppressing means is composed of a transmission line.

14. A predistortion circuit, comprising:

an input terminal for inputting a predetermined signal;

a nonlinear device directly or indirectly connected to said input terminal;

a bias supply circuit for applying a voltage to said nonlinear device;

specific-frequency suppressing means connected to one side or both sides of said nonlinear device directly without another intervening device, said specific-frequency suppressing means suppressing all or part of such frequencies that are from a frequency corresponding to DC to a frequency corresponding to an occupied band width of an input signal inputted to said input terminal; and an output terminal for outputting a signal;

wherein said specific-frequency suppressing means is composed of a transmission line and a capacitor interconnected in series.

15. A predistortion circuit comprising:

an input terminal for inputting a predetermined signal;

a nonlinear device directly or indirectly connected to said input terminal;

a bias supply circuit for applying a voltage to said nonlinear device;

specific-frequency suppressing means connected to one side or both sides of said nonlinear device directly without another intervening device, said specific-frequency suppressing means suppressing at least one higher harmonic frequency of a carrier wave of said input signal; and an output terminal for outputting a signal;

wherein said specific-frequency suppressing means has such impedance that the impedance of said specific-frequency suppressing means viewed from the connection point to which said specific-frequency suppressing means is connected is lower than the impedance of said nonlinear device viewed from said connection point at said one higher harmonic frequency of a carrier wave of said input signal.

16. A predistortion circuit of claim 15, wherein said one higher harmonic frequency is the second harmonic frequency.

17. A predistortion circuit of claim 15, wherein said specific-frequency suppressing means is composed of lumped parameter components interconnected in series.

18. A predistortion circuit of claim 15, wherein said specific-frequency suppressing means is composed of a transmission line.

19. A predistortion circuit of claim 15, wherein said specific-frequency suppressing means is composed of a transmission line and a capacitor interconnected in series.

* * * * *

UNITED STATES PATENT AND TRADEMARK OFFICE
CERTIFICATE OF CORRECTION

PATENT NO. : 6,933,780 B2
DATED : August 23, 2005
INVENTOR(S) : Fujiwara et al.

It is certified that error appears in the above-identified patent and that said Letters Patent is hereby corrected as shown below:

Title page,
Item [57], ABSTRACT, should read:
    A predistortion circuit has an input terminal for inputting a predetermined signal; a nonlinear device directly or indirectly connected to the input terminal; a bias supply circuit for applying a voltage to the nonlinear device; a specific-frequency suppressing device connected to one side or both sides of the nonlinear device directly without another intervening device for suppressing all or part of such frequencies that are from a frequency corresponding to DC to a frequency corresponding to an occupied band width of an input signal inputted to the input terminal and/or suppressing at least one higher harmonic frequency of a carrier wave of the input signal; and an output terminal for outputting a signal.

Signed and Sealed this

Twenty-first Day of February, 2006

JON W. DUDAS
*Director of the United States Patent and Trademark Office*